United States Patent [19]

Mahl

[11] 4,214,853
[45] Jul. 29, 1980

[54] EVACUATION APPARATUS WITH CRYOGENIC PUMP AND TRAP ASSEMBLY

[75] Inventor: Gunard O. B. Mahl, San Francisco, Calif.

[73] Assignee: CHA Industries, Menlo Park, Calif.

[21] Appl. No.: 905,652

[22] Filed: May 15, 1978

[51] Int. Cl.$^2$ .............................................. F04F 9/06
[52] U.S. Cl. ...................................... 417/154; 62/55.5
[58] Field of Search ........................ 62/55.5, 100, 268; 55/269; 417/152–154, 244; 118/49, 48, 715

[56] References Cited

U.S. PATENT DOCUMENTS

| | | | |
|---|---|---|---|
| 3,019,809 | 2/1962 | Ipsen et al. | 62/55.5 X |
| 3,168,819 | 2/1965 | Sarteler | 62/55.5 |
| 3,252,652 | 5/1966 | Trendelebury et al. | 62/55.5 X |
| 3,288,354 | 11/1966 | Dennis | 417/154 |
| 3,423,947 | 1/1969 | Mariya | 62/55.5 X |
| 3,643,625 | 2/1972 | Mahl | 118/48 |
| 3,649,339 | 3/1972 | Smith | 417/152 |
| 3,785,162 | 1/1974 | Long et al. | 417/153 X |
| 3,998,347 | 12/1979 | Mahl | 220/69 X |
| 4,117,694 | 10/1978 | Belmore | 62/55.5 |

FOREIGN PATENT DOCUMENTS 1046250 12/1958 Fed. Rep. of Germany ........... 417/154

Primary Examiner—Carlton R. Croyle
Assistant Examiner—Edward Look
Attorney, Agent, or Firm—Phillips, Moore, Weissenberger, Lempio & Majestic

[57] ABSTRACT

A thin-film deposition apparatus comprises a cabinet having a vessel mounted therein which defines a vacuum chamber adapted to retain processed articles. A vacuum unit is mounted adjacent to the vessel to communicate in substantially unrestricted communication with an inlet opening to the vacuum chamber for selectively evacuating the same. A valve is reciprocally mounted in a chamber communicating with the inlet opening to selectively expose the inlet opening during the evacuation process. A plurality of water-cooled and V-shaped baffles or a primary trap is mounted between the piston and the vacuum unit to provide an optically dense view of the vacuum chamber from the downstream side of the trap and to trap contaminants, such as oil droplets, prior to their ingress into the vacuum chamber from the vacuum unit. In addition, a plurality of fins or a secondary trap is mounted in nesting relationship within the baffles to provide an optically dense view of the primary trap from the vacuum chamber side thereof. The fins are secured between a pair of laterally spaced copper plates which function to maintain the fins at a substantially low temperature level and further function as a cryogenic pump. The plates are exposed to liquid nitrogen temperature retained in a cooling chamber partially circumventing the valve chamber. A source of vaporizable material, retained in the vacuum chamber, is masked-off from egress into the valve chamber by baffle plates surrounding the same.

30 Claims, 5 Drawing Figures

EVACUATION APPARATUS WITH CRYOGENIC PUMP AND TRAP ASSEMBLY

BACKGROUND OF THE INVENTION

This invention relates to an evacuation apparatus, such as a vacuum deposition apparatus which is adapted to deposit a thin-film of material over articles or substrates retained in a vacuum chamber.

An apparatus of this type normally comprises a plurality of racks mounted in a vacuum chamber for retaining processed articles, such as silicon wafers. U.S. Pat. No. 3,643,625, for example, discloses such an apparatus wherein a vertically disposed vacuum chamber is defined within a bell jar mounted on a stationary support. During processing, a vacuum is drawn within the jar and material, such as metal, is vaporized to deposit a thin coating thereof on the articles.

Mechanical and oil diffusion pumps are normally employed to draw the vacuum. In addition, a water-cooled baffle and a liquid nitrogen cooled trap are normally arranged in series between the diffusion pump and the vacuum chamber. The baffle and trap function to trap oil vapors emanating from the diffusion pump. The liquid nitrogen trap also functions to adsorb water vapor from the air evacuated from the vacuum chamber.

Arrangements of this type exhibit undue obstructions and restrictions in the flow path between the pumps and vacuum chamber whereby the vacuum normally cannot be drawn as expeditiously and efficiently, as desired. Furthermore, the limited surface areas on the liquid nitrogen cooled trap do not assure adequate trapping of water vapors. In order to enhance pumping speed, some manufacturers eliminate the water-cooled baffle and replace it with a "cold cap" maintained at ambient temperature. This device does not stop primary backstreaming.

The liquid nitrogen trap then tends to become coated with frozen oil to not only lower the efficiency of the evacuation system, but to also cause a problem when frozen oil droplets shatter and are propelled from the trap and into the vacuum chamber, i.e., the "cold cap" does not provide an optically dense baffle system to prevent migration of the oil vapors emanating from the diffusion pump onto the trap surfaces.

Another problem encountered with conventional evacuation systems of this type involves the inability to expeditiously assembly and disassemble the water-cooled baffle and liquid nitrogen cooled trap for servicing purposes. Such servicing is laborious and time consuming, normally requiring a complete dismantling of the system.

The disposition of the source of vaporizable material in the vacuum chamber can give rise to the problem of permitting such material to egress into the inlet to the pumping chamber whereat the vacuum is drawn. One solution to this problem has been the mounting of baffles at such inlet. This arrangement causes further problems, such as the addition of obstructions and restrictions in the flow path between the pumps and the vacuum chamber which tend to further decrease the ability to expeditiously and efficiently draw a vacuum.

Since every surface of a pumping system may become contaminated through normal use or error, it is important that all surfaces be accessible for cleaning purposes. Prior art pumping systems, particularly the valve and cryogenic portions thereof, have not exhibited the capability of being readily disassembled for such cleaning.

Problems also exist in some vacuum systems in gaining access to the major valve mechanism which separates the vacuum chamber from an adjacent pumping chamber. This can lead to considerable down-time when repairs to the valve mechanism are required.

SUMMARY OF THIS INVENTION

An object of this invention is to overcome the above, briefly described problems by providing a compact and highly efficient evacuation apparatus whereby a vacuum may be efficiently drawn within a vacuum chamber expeditiously and in a substantially unrestricted manner. In addition, contaminants, such as oil, are substantially prevented from ingressing into the vacuum chamber during the deposition process and moisture in the evacuated air is efficiently adsorbed. The apparatus is further constructed to facilitate expeditious servicing thereof. A source of vaporizable material is mounted in the vacuum chamber and preferably positioned and shielded by baffle means to prevent the material from directly entering the inlet to the pumping chamber (and outlet from the vacuum chamber) whereat the vacuum is drawn.

In one aspect of the invention, the evacuation apparatus comprises a vessel defining a vacuum chamber therein and a vacuumizing means communicating with an inlet opening to the vacuum chamber for selectively drawing a vacuum therein. A cryogenic pump means is disposed adjacent to the opening for substantially freezing-out water vapor contained in the evacuated air. A valve means is preferably mounted adjacent to the inlet opening to the vacuum chamber and is adapted to selectively open or close the inlet opening.

Another novel aspect of this invention comprises the disposition of water-cooled baffle means between the vacuum chamber and an oil diffusion pump of the apparatus and cryogenically cooled fin means mounted in nested relationship within the baffle means. The baffle means and fin means provide substantially open communication to the vacuum chamber and the baffle means preferably provides an optically dense view of the vacuum chamber whereas the fin means preferably provides an optically dense view of the baffle means.

Still another novel aspect of this invention pertains to the construction and arrangement of the cryogenic pump means whereby it can be removed expeditiously from the apparatus as a unit for servicing purposes, along with the baffle means and fin means. This also allows ready access to the head of the valve means for servicing purposes.

An additional novel aspect of this invention permits relative dispositions of a vaporizable source of material in the vacuum chamber, low location of the inlet opening to the pumping chamber, and the mounting of baffle means adjacent to the source to prevent direct entrance of the material into the inlet opening to the pumping chamber.

Although novel aspects of this invention find particular application to a vacuum deposition apparatus, it should be understood by those skilled in the art that other applications may be readily made therewith. For example, various constructions and arrangements of the apparatus herein disclosed may find application to ion-milling systems, vacuum furnaces and other types of vacuum systems.

BRIEF DESCRIPTION OF THE DRAWINGS

Other objects of this invention will become apparent from the following description and accompanying drawings wherein.

DETAILED DESCRIPTION

Figure 1:
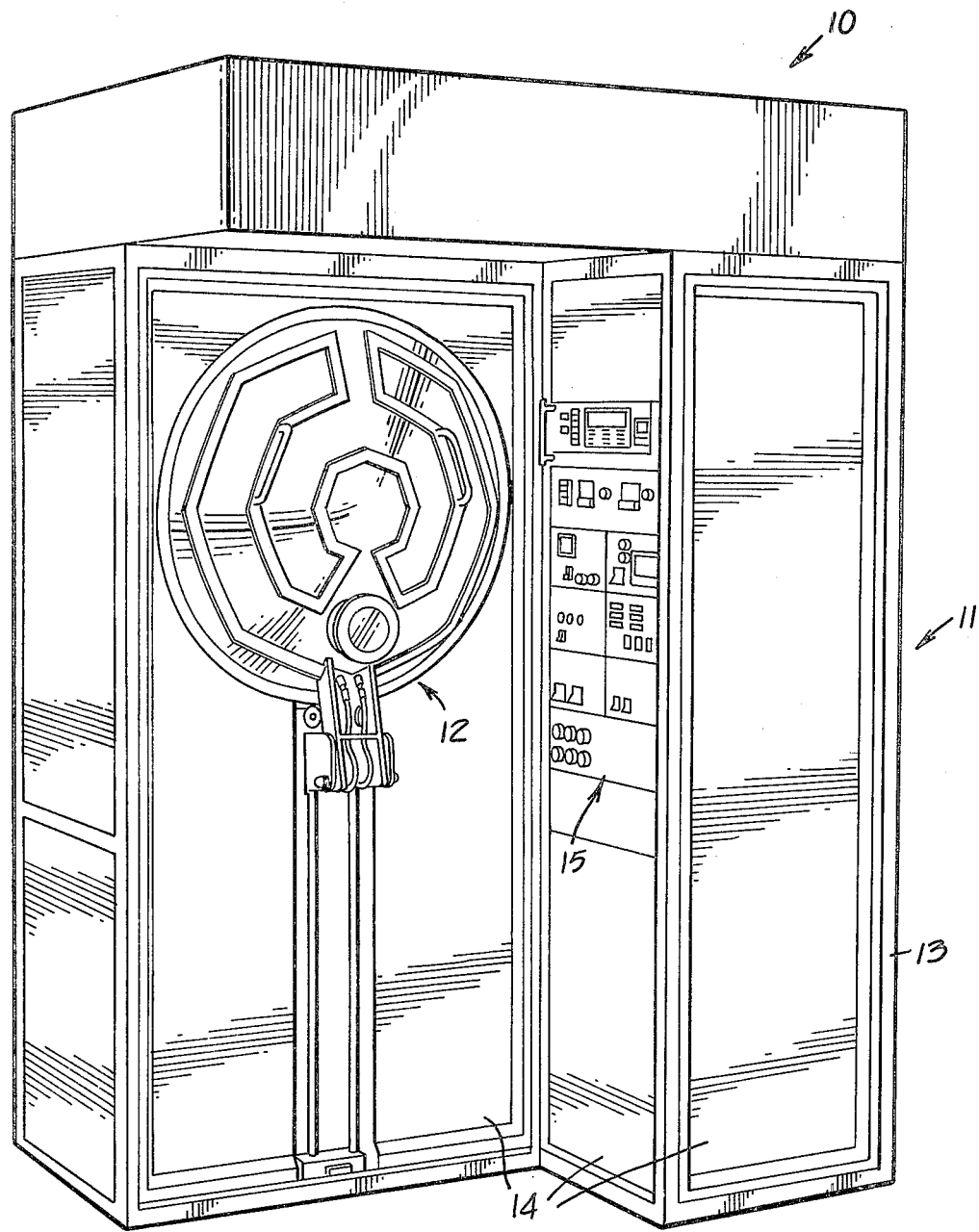
FIG. 1 is a front perspective view of a vacuum deposition apparatus embodying this invention therein.

FIG. 1 illustrates a deposition apparatus 10 comprising an upstanding cabinet 11 having a door assembly 12 movably mounted thereon to normally close an inlet to a vacuum chamber defined in the cabinet. As disclosed in U.S. Pat. No. 3,643,625, articles, such as silicon wafers, are adapted to be mounted on racks (not shown) placed in the vacuum chamber and thereafter coated with a thin-film of vaporized material, such as metal. Upon completion of the coating process, the door assembly is opened and the processed articles are removed whereby the process may be repeated.

Figure 3:
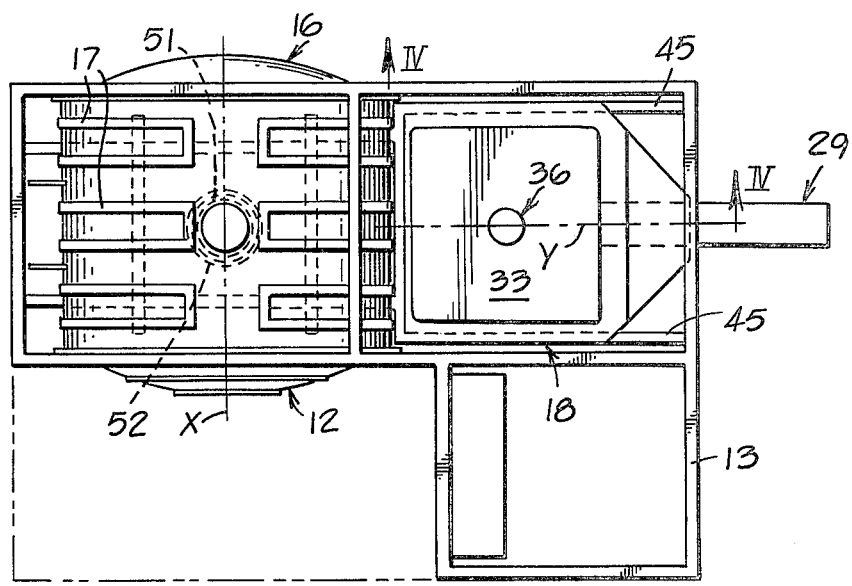
FIG. 3 is a top elevational view of the deposition apparatus.
Figure 2:
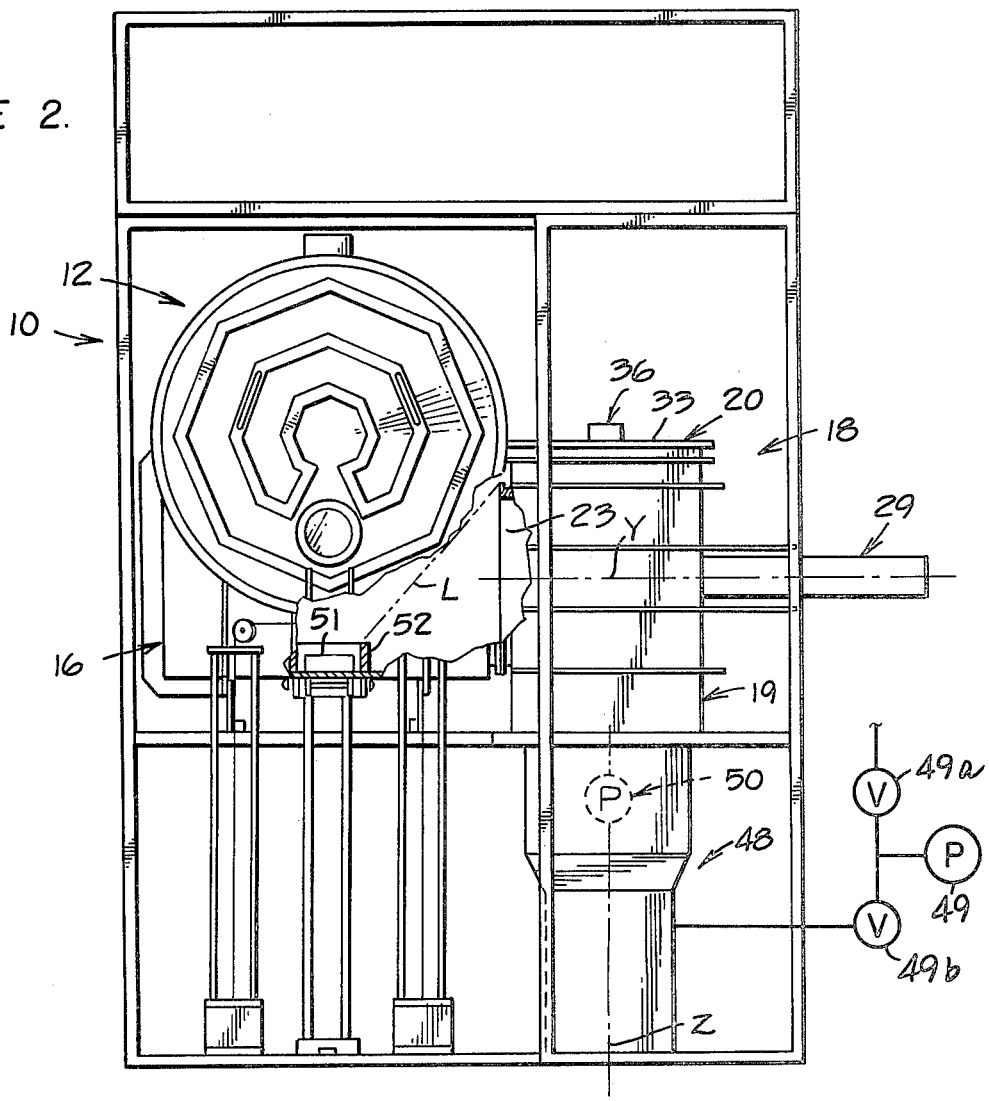
FIG. 2 is a front elevational view of the deposition apparatus, but showing panels thereof removed.

Referring to FIGS. 1-3, cabinet 11 comprises an integrated frame structure 13 having a plurality of panels 14 removably mounted thereon. A control panel 15, conveniently mounted on the frame structure adjacent to door assembly 12, is adapted to control the operating mechanisms of the apparatus.

As shown in FIG. 3, a generally cylindrical vessel 16 is mounted on frame structure 13 and defines a vacuum chamber therein, having its longitudinal axis X disposed horizontally.

Figure 4:
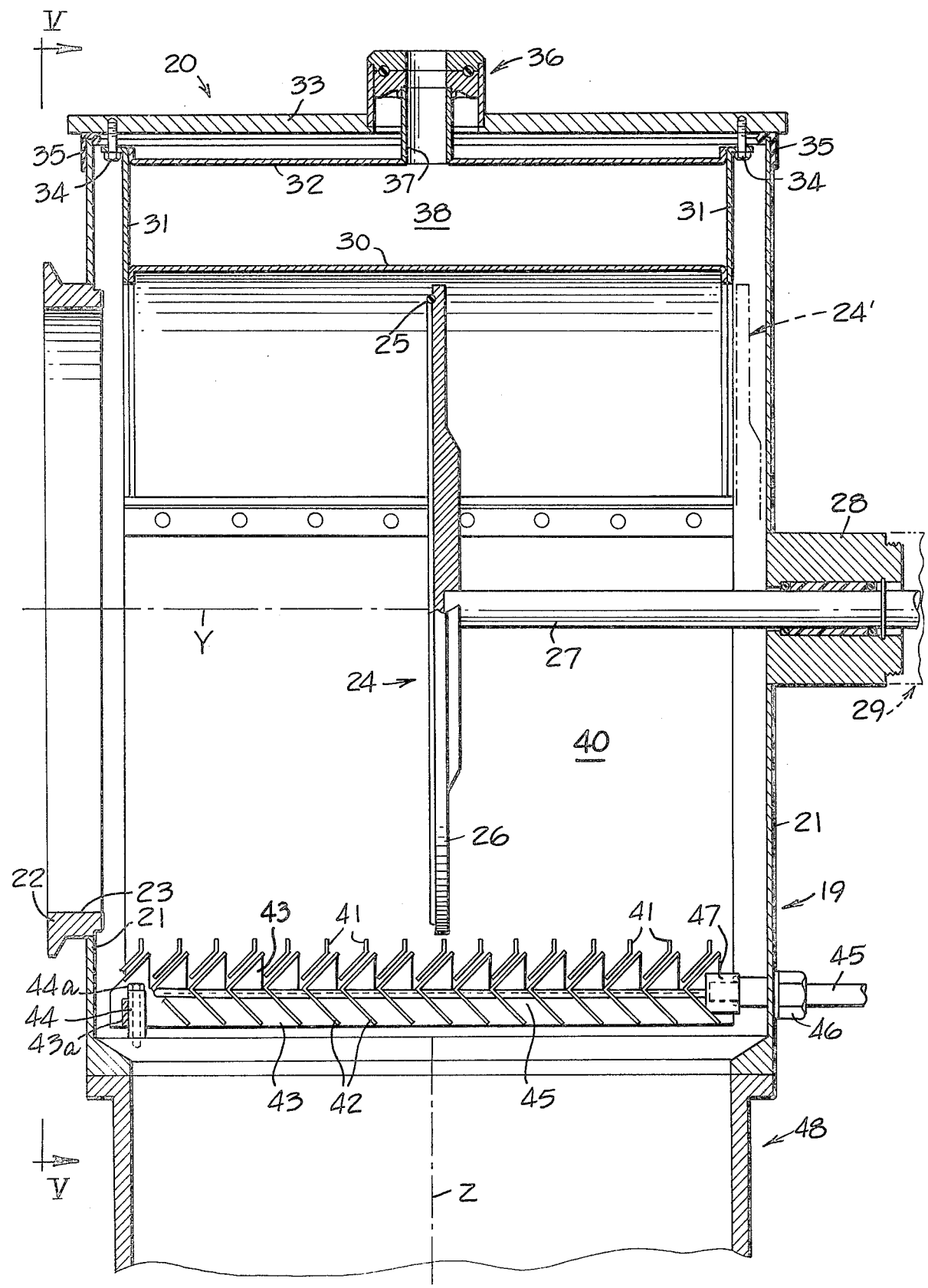
FIG. 4 is an enlarged sectional view, taken in the direction of arrows IV—IV in FIG. 3.
Figure 5:
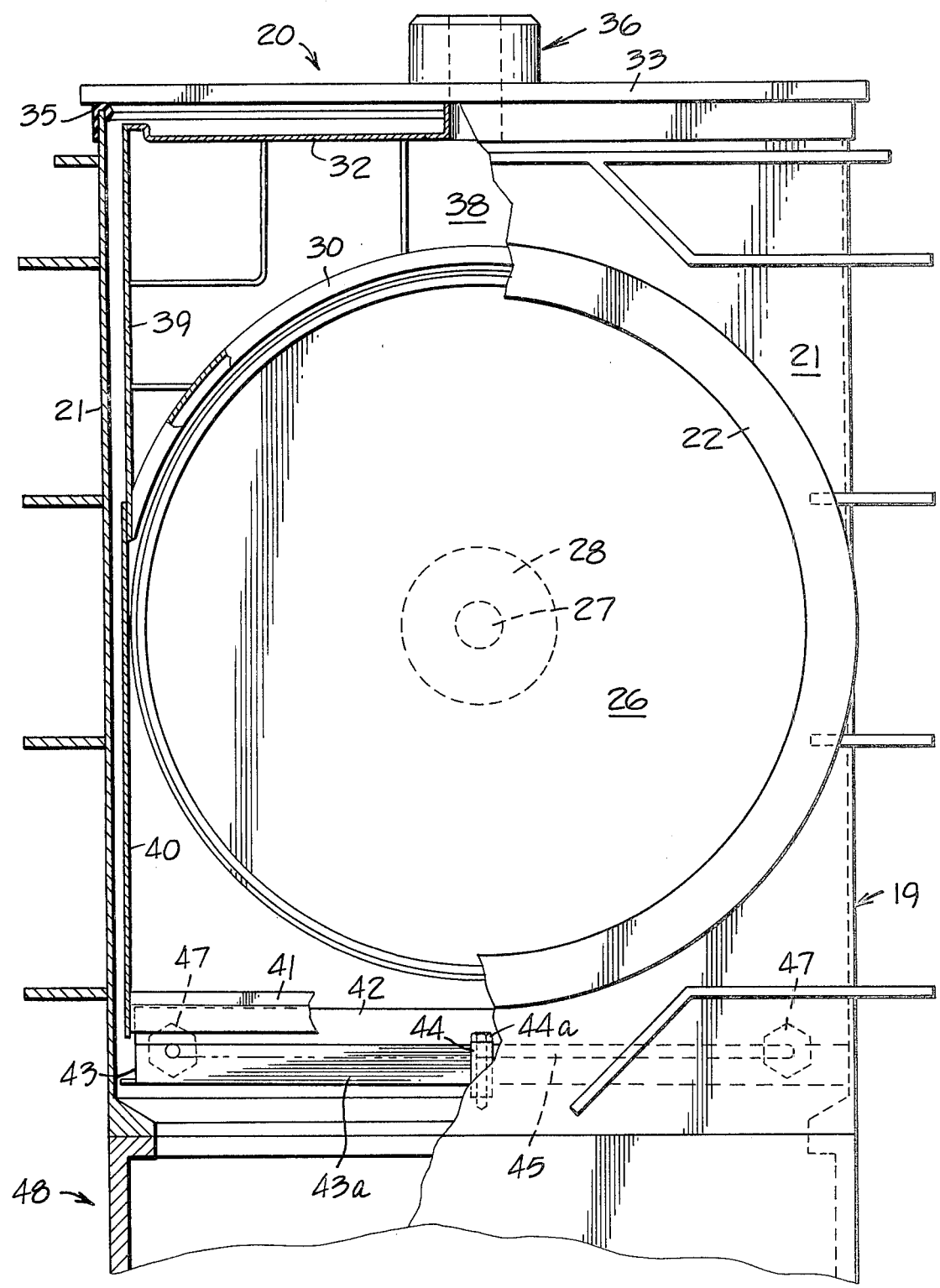
FIG. 5 is a view taken in the direction of arrows V—V in FIG. 4.

As suggested above, articles to be processed are adapted to be mounted on racks (not shown) positioned in the vacuum chamber upon opening of door assembly 12. A plurality of intercommunicating and longitudinally spaced channels 17 substantially circumvent vessel 16 and are connected to a pressurized coolant source to selectively circulate a coolant, such as water, therethrough. A vacuumizing means 18 comprises an upstanding stationary housing 19 securely mounted on frame structure 13 and vertically disposed adjacent to a side of vessel 16. Referring to FIGS. 4 and 5, housing 19 encloses an upper valve and cryogenic pump section 20 and includes outer walls 21 forming an outer enclosure therefor.

An annular collar 22 is secured to a wall 21 of section 20 to define an outlet opening 23 from the vacuum chamber defined in vessel 16. A piston-like valve means or gate valve 24 is reciprocally mounted in a pumping chamber, defined in section 20 and having its inlet common with opening 23, to be moved in the direction of an axis Y, between a fully retracted and opened position 24' (FIG. 4) and a closed position whereby an annular O-ring seal 25, secured on a head 26 thereof, will engage collar 22 in sealing contact therewith. A rod 27 of the piston is reciprocally mounted on a boss 28, secured to a wall 21, and is adapted to be selectively reciprocated by a double-acting air or hydraulic cylinder 29 (FIG. 3).

The upper portion of the piston is partially enclosed circumferentially by an arcuate plate 30 secured between a pair of longitudinally spaced and vertically disposed plates 31. As more clearly shown in FIG. 5, a flat upper plate 32 is spaced radially outwardly from plate 30 and is also secured between plates 31. A cover plate 33, detachably secured to plates 31 by releasable fastening means such as bolts 34, completely encloses section 20.

J-shaped elastomeric seals 35, which may be of the type disclosed in U.S. Pat. No. 3,998,347, are mounted on the entire periphery of upper edges of plates 21 to engage cover plate 33 in static vacuum sealing contact. A fitting 36, adapted for disassembly, is secured centrally on cover plate 33 and has a tube 37 secured thereto which is further secured to plate 32. As will be described hereinafter, liquid nitrogen or the like is adapted to be communicated through the tube to fill a crescent-shaped chamber 38 defined in part by plates 30, 31 and 32. As a result of the use of bolts 34, and the disassembility of fitting 36, all surfaces of cryogenic pump section 29 are made readily available for cleaning.

Referring to FIG. 5, chamber 38 is further defined by a pair of laterally spaced plates 39 (one shown), secured between plates 30 and 32. It should be noted in FIGS. 4 and 5 that plates 31 and 39 are spaced inwardly relative to outer enclosure plates 21 to insure that the latter plates are not reduced to liquid nitrogen temperature. Conduction means in the form of a pair of vertically disposed copper-based plates 40, each having its upper end secured to a respective plate 39, is adapted to conduct the relatively low temperature of the liquid nitrogen retained in chamber 38 to a plurality of cooling fins 41 secured thereto. As will be hereinafter more fully described, plates 30 and 40 define substantial cryogenically-cooled primary trap surfaces to provide an efficient cryogenic pump means for freezing-out water vapor from air evacuated from the vacuum chamber.

The cooling fins extend fully across the lower end of section 20 and are spaced apart from each other longitudinally in the direction of axis Y (FIG. 4) to provide substantially unobstructed openings therebetween which permit the efficient drawing of a vacuum therethrough. The fins, maintained at approximately $-196°$ C., function as a secondary trap to also adsorb (freeze-out) water vapor which would otherwise interfere with the processing of articles within the vacuum chamber defined in vessel 16. As discussed more fully hereinafter, the fins and plates 30,31,33 and 40 may be removed as a unit for servicing purposes.

As shown in FIGS. 4 and 5, a baffle assembly comprising a plurality of longitudinally spaced and water-cooled chevron or V-shaped baffles 42 are secured between a pair of laterally spaced mounting plates 43 (one shown in FIG. 4). The upper end of each plate has a sawtooth configuration to receive and support extension tabs of the baffles therein. A support tube 44 is secured to a third plate 43a, secured to forward ends of plates 43, and is detachably secured to a base of housing 19 by a bolt 44a. Tube 44, baffles 42 and plates 43 are spaced and maintained out of contact with respect to plates 40 and fins 41 to prevent the relatively low temperature of the plates and fins from being conducted to the baffle assembly and to housing 19.

A conduit 45, U-shaped when viewed in top plan, is secured to baffles 42 for maintaining the baffles in a cooled condition. Tap water is adapted to be circulated through the conduit for this purpose. Each end of the conduit is adapted to be disconnected from the baffle assembly by a pair of threaded collars 46 and 47 to permit removal of the baffle assembly upon uncoupling of the collars and removal of bolt 44a. As shown in FIG. 4, the baffles are maintained out of contact with respect to fins 41 whereby the cryogenic temperature of the fins will not be conducted to the baffles.

Referring to FIGS. 2-4, housing 19 further encloses a pumping section 48 mounted vertically below section 20 and disposed on a longitudinal axis Z thereof. It should be noted in FIGS. 2 and 3 that axis Z is preferably disposed in perpendicular relationship relative to axis Y of section 20 and that axis Y is preferably disposed in perpendicular relationship relative to axis X. The pumping section comprises vacuumizing means for aiding the above-described cryogenic pump means comprising plates 30 and 40 for evacuating the vacuum chamber of vessel 16. The vacuumizing means includes a standard mechanical suction pump 49 and a standard oil diffusion pump 50, associated with a roughing valve 49a (which further communicates with the vacuum chamber) and foreline valve 49b for selectively isolating the vacuumizing means in a conventional manner.

Pumps 49 and 50 function in a conventional manner to draw a vacuum in the vacuum chamber defined in vessel 16 (FIG. 3) upon full retraction and opening of valve means 24 (FIG. 4). It should be noted that fins 41 and baffles 42 are suitably spaced to provide substantially unobstructed communication between the vacuumizing means and the vacuum chamber. It should be again noted that longitudinal axis Y of the chamber defined by plates 30 and 40 is disposed in axial alignment with respect to outlet opening 23 from the vacuum chamber and transversely relative to longitudinal axis Z of vacuumizing means or section 47. The vertical disposition of head 26 of the valve means prevents debris from collecting on the head and migrating onto seal 25. This arrangement aids in maintaining seal 25 free from contamination whereby the seal will function properly.

Referring to FIGS. 2 and 3, a source of vaporizable material 51 is mounted adjacent to a bottom plate of the vacuum chamber and is preferably disposed horizontally at a level approximately aligned with a lower end of outlet opening 23 (FIG. 2). A baffle means 52 is mounted adjacent to the source means and between the source means and the outlet opening for preventing direct ingress of the vaporized material into the outlet opening, as depicted by line L. The baffle means may comprise a cylindrical plate surrounding the source means. In conventional deposition apparatus of this type, a corresponding outlet opening is normally located higher-up in a vacuum chamber and a baffle arrangement is required at the outlet opening.

In operation, the operator may open door means 12 (FIGS. 1 and 2) in the manner described in U.S. Patent Application Ser. No. 906,025 filed on May 15, 1978 by Gunard O. B. Mahl for "Vacuum Chamber Door Assembly". The vacuum chamber defined in vessel 16 is thus fully exposed whereby articles to be processed, such as silicon wafers or other substrates, may be suitably mounted on racks retained in the vacuum chamber. Upon such mounting, the door is again closed prior to effecting the coating of the articles. During this step, valve means 24 will be kept in its closed position (FIG. 4). Upon manipulation of the appropriate controls on control panel 15 (FIG. 1) the vacuum chamber is evacuated and a heating means (not shown) mounted in the vacuum chamber may be activated to bake-out the articles prior to final processing.

It should be noted that baffles 42 (FIG. 4) are disposed between the vacuum chamber and the vacuumizing means to not only provide substantial open and unrestricted communication therebetween (upon retraction of piston 24), but to also substantially prevent the ingress of contaminants into the vacuum chamber from the vacuumizing means. For example, the refluxing or boiling of oil in the area of oil diffusion pump 50 (FIG. 2) will tend to disperse oil vapors upwardly therefrom in FIG. 4. Each adjacent pair of water cooled baffles 42 at least approximately overlap each other to function as collectors to prevent the passing of such oil thereby and to permit return of the condensed oil back to the diffusion pump. Furthermore, the baffles provide an optically dense view of fins 41 and inlet opening 23 when viewed from the downstream side of the baffles to aid in this masking function.

Fins 41 function as part of the primary trap comprising these fins and cryogenically cooled plates 30 and 40. The fins are positioned to provide an optically dense view of baffles 42 when viewed from opening 23 and the upstream side of the baffles. Since the fins are completely masked by the baffles, primary oil vapors will not contact the fins to thus avoid the above-discussed "shattering" phenomena. The fins also serve as a secondary trap for adsorbing any minute quantities of oil vapor which may have progressed past the baffles due to intermolecular collisions.

After the desired vacuum has been achieved, the material of source means 51 is then suitably heated and vaporized in a conventional manner to disperse evaporated material, such as metal, within the vacuum chamber whereby the articles are coated with the material. As discussed above, baffle means 52 will prevent direct ingress of the vaporized material into opening 23. After the process has been completed, valve means 24 is closed and the vacuum chamber vented to ambient. The coated articles are then removed from the vacuum chamber and the process repeated as described above.

It should be again noted in FIGS. 4 and 5 that plates 30, 31, 32, 33 and 40 and fins 41 are structurally integrated to form a sub-assembly which may be readily removed for servicing purposes as a unit. In particular, plates 31 are secured to cover plate 33 by bolts 34 and the cover plate rests in unsecured relationship on J-shaped seals 35. Thus, rightward movement of valve means 24 to its retracted position 24' in FIG. 4 to dispose head 26 in the clearance defined between plates 21 and 31 will permit the subassembly to be removed upwardly from housing 19. If so desired, the baffle assembly comprising baffles 42 and plates 43 and 43a can be removed from the housing by uncoupling collars 46 from collars 47 and by releasing bolt 44a.

What is claimed is:
1. An evacuation apparatus comprising
a vessel defining a vacuum chamber therein,
vacuumizing means communicating with an opening to said vacuum chamber for selectively drawing a vacuum therein comprising cryogenic pump means disposed closely adjacent to said opening and defined by substantial cryogenically cooled trap surfaces for freezing-out water vapor from air evacuated from said vacuum chamber, said opening being common to said vacuum chamber and to said cryogenic pump means,
valve means for selectively opening or closing the opening to said vacuum chamber and movable from a first position within said cryogenic pump means closing said opening to a second position within said cryogenic pump means directly expos- ing said vacuum chamber to said cryogenic pump means, through said opening, baffle means disposed closely adjacent to the opening to said vacuum chamber for providing substantial open communication to said vacuum chamber and for substantially preventing ingress of contaminants into said vacuum chamber, said baffle means being positioned to provide an optically dense view of said opening when viewed from a downstream side of said baffle means, and a plurality of longitudinally spaced and cryogenically cooled fins mounted in nested relationship within said baffle means and disposed in out-of-contact relationship therewith, said fins being positioned to provide an optically dense view of the downstream side of said baffle means when viewed from said openings.

2. The apparatus of claim 1 wherein said valve means comprises a piston reciprocally mounted in a pumping chamber, defined by said trap surfaces, communicating with the opening to said vacuum chamber.

3. The apparatus of claim 2 wherein a longitudinal axis of said pumping chamber is disposed in non-intersecting relationship with respect to the opening to said vacuum chamber and transversely relative to a longitudinal axis of said vacuum chamber.

4. The apparatus of claim 3 wherein said vacuumizing means further comprises vacuum pump means disposed in transverse alignment relative to the longitudinal axis of said pumping means.

5. The apparatus of claim 1 wherein said vacuumizing means further comprises diffusion pump means disposed on a downstream side of said baffle means.

6. The apparatus of claim 1 wherein said baffle means comprises a plurality of longitudinally spaced baffles.

7. The apparatus of claim 6 wherein each of said baffles is V-shaped.

8. The apparatus of claim 6 further comprising means for circulating a coolant to cool said baffles.

9. The apparatus of claim 6 wherein said baffles are secured between a pair of laterally spaced plates.

10. The apparatus of claim 1 further comprising means for maintaining said fins at a cryogenic temperature level substantially lower than the temperature level of said baffles.

11. The apparatus of claim 1 wherein said fins are secured between a pair of laterally spaced plates defining at least some of said trap surfaces interiorly thereon and further comprising means defining a chamber in said apparatus, at least partially about said trap surfaces, retaining a low temperature coolant therein for conducting the temperature of said coolant through plates and to said fins.

12. The apparatus of claim 11 wherein said last-mentioned chamber is defined by a pair of longitudinally spaced first plates and a pair of radially disposed and crescent-shaped second plates secured to said first plates.

13. The apparatus of claim 12 further comprising a cover plate removably mounted in sealing relationship on said apparatus and secured to said first plates whereby said cover plate, said first and second plates and said baffle means may be removed from said apparatus as a unit for servicing purposes.

14. An evacuation apparatus comprising
a vessel defining a vacuum chamber therein,
a vacuumizing means, including a diffusion pump, communicating with an opening to said vacuum chamber for selectively drawing a vacuum therein,
baffle means disposed between said vacuum chamber and said diffusion pump for providing substantial open communication therebetween and for substantially preventing ingress of oil into said vacuum chamber from said diffusion pump, and
cryogenically cooled fin means mounted in nested relationship within said baffle means and disposed on an upstream side thereof towards said opening.

15. The apparatus of claim 14 wherein said baffle means comprises a plurality of longitudinally spaced baffles and said fin means comprises a plurality of longitudinally spaced fins.

16. The apparatus of claim 15 wherein each of said baffles is at least generally V-shaped and each adjacent pair of baffles at least approximately overlaps each other.

17. The apparatus of claim 15 further comprising means for circulating a coolant to cool said baffles.

18. The apparatus of claim 15 wherein said baffles and said fins are maintained in spaced-apart relationship relative to each other.

19. The apparatus of claim 18 wherein said plates are essentially composed of copper.

20. The apparatus of claim 14 wherein said baffle means is positioned to provide an optically dense view of said opening when viewed from a downstream side of said baffle means and wherein said fin means is positioned to provide an optically dense view of the downstream side of said baffle means when viewed from said opening.

21. The apparatus of claim 14 further comprising means for maintaining said fin means at a cryogenic temperature level substantially below the temperature level of said baffle means.

22. A cryogenic pump adapted for use in an evacuation apparatus comprising
a housing defining an opening to a vacuum chamber,
a plurality of metallic plates defining a first chamber therein communicating with said vacuum chamber through said opening and further defining a second chamber at least partially surrounding said first chamber and adapted to be at least partially filled with a cryogenic liquid, said plates disposed in spaced-apart relationship relative to said housing, and
a cover attached to said plates and disposed in sealing relationship on said housing whereby said cover and plates, defining both said first and second chambers, may be removed from said housing as a unit.

23. The pump of claim 22 further comprising valve means reciprocally mounted on said housing for selectively opening or closing said opening.

24. The pump of claim 23 wherein said valve means comprises a head retractable to a position between said plates and said housing for permitting said plates to move upwardly thereby upon removal thereof from said housing.

25. The pump of claim 22 further comprising a plurality of longitudinally spaced fins mounted on lower ends of said plates.

26. The pump of claim 25 wherein said fins are secured between a spaced pair of said plates and are adapted to be cryogenically cooled thereby.

27. The pump of claim 26 wherein said fins are positioned to provide an optically dense view downstream of said fins when viewed from said opening.

28. An evacuation apparatus comprising
a vessel defining a vacuum chamber therein,
vacuumizing means communicating with an opening to said vacuum chamber for selectively drawing a vacuum therein comprising cryogenic pump means disposed closely adjacent to said opening and defined by substantial cryogenically cooled trap surfaces for freezing-out water vapor from air evacuated from said vacuum chamber,
baffle means disposed closely adjacent to the opening to said vacuum chamber for providing substantial open communication to said vacuum chamber and for substantially preventing ingress of contaminants into said vacuum chamber, said baffle means being positioned to provide an optically dense view of said opening when viewed from a downstream side of said baffle means,
a plurality of longitudinally spaced and cryogenically cooled fins mounted in nested relationship within said baffle means and disposed in out-of-contact relationship therewith, said fins being positioned to provide an optically dense view of the downstream side of said baffle means when viewed from said opening and being secured between a pair of laterally spaced plates defining at least some of said trap surfaces interiorly thereon, and means defining a chamber in said apparatus, at least partially about said trap surfaces, retaining a low-temperature coolant therein for conducting the temperature of said coolant through said plates and to said fins.

29. An evacuation apparatus comprising
a vessel defining a vacuum chamber therein,
a vacuumizing means, including a diffusion pump, communicating with an opening to said vacuum chamber for selectively drawing a vacuum therein,
baffle means, including a plurality of longitudinally spaced baffles, disposed between said vacuum chamber and said diffusion pump for providing substantial open communication therebetween and for substantially preventing ingress of oil into said vacuum chamber from said diffusion pump, and
cryogenically cooled fin means, including a plurality of fins secured between a pair of laterally spaced plates and mounted in nested and spaced apart relationship within said baffles disposed on an upstream side thereof towards said opening.

30. A cryogenic pump adapted for use in an evacuation apparatus comprising
a housing defining an opening to a vacuum chamber,
a plurality of metallic plates defining a first chamber therein communicating with said vacuum chamber through said opening and a second chamber at least partially surrounding said first chamber and adapted to be at least partially filled with a cryogenic liquid, said plates disposed in spaced-apart relationship relative to said housing,
a cover attached to said plates and disposed in sealing relationship on said housing whereby said cover and plates may be removed from said housing as a unit, and
a plurality of longitudinally spaced fins mounted on lower ends of said plates.

* * * * *